(12) United States Patent
Nagai

(10) Patent No.: US 10,453,518 B1
(45) Date of Patent: Oct. 22, 2019

(54) LAYOUT OF SENSE AMPLIFIER

(71) Applicants: UNITED MICROELECTRONICS CORP., Hsin-Chu (TW); Fujian Jinhua Integrated Circuit Co., Ltd., Quanzhou, Fujian Province (CN)

(72) Inventor: Yukihiro Nagai, Saijo (JP)

(73) Assignees: UNITED MICROELECTRONICS CORP., Hsin-Chu (TW); Fujian Jinhua Integrated Circuit Co., Ltd., Quanzhou, Fujian Province (CN)

(*) Notice: Subject to any disclaimer, the term of this patent is extended or adjusted under 35 U.S.C. 154(b) by 0 days.

(21) Appl. No.: 15/975,790

(22) Filed: May 10, 2018

(30) Foreign Application Priority Data

Apr. 20, 2018 (CN) .......................... 2018 1 0361216

(51) Int. Cl.
| | |
|---|---|
| *G11C 11/4091* | (2006.01) |
| *H01L 29/06* | (2006.01) |
| *H01L 23/528* | (2006.01) |
| *G11C 11/408* | (2006.01) |
| *H01L 27/092* | (2006.01) |
| *H01L 27/108* | (2006.01) |
| *H01L 27/02* | (2006.01) |
| *H01L 23/522* | (2006.01) |

(52) U.S. Cl.
CPC ...... *G11C 11/4091* (2013.01); *G11C 11/4085* (2013.01); *H01L 23/5226* (2013.01); *H01L 23/5283* (2013.01); *H01L 27/0207* (2013.01); *H01L 27/092* (2013.01); *H01L 27/10897* (2013.01); *H01L 29/0649* (2013.01)

(58) Field of Classification Search
CPC ........ G11C 11/4091; G11C 11/06–067; G11C 7/12; G11C 7/18; H01L 27/0207; H01L 27/0203; H01L 29/0649
See application file for complete search history.

(56) References Cited

U.S. PATENT DOCUMENTS

| | | | |
|---|---|---|---|
| 6,690,053 B2 | 2/2004 | Amo | |
| 2005/0248672 A1* | 11/2005 | Kim ........................ | G11C 7/12 365/203 |
| 2008/0042171 A1* | 2/2008 | Mosler ...................... | G03F 1/30 257/288 |
| 2008/0116496 A1 | 5/2008 | Tzeng | |

* cited by examiner

*Primary Examiner* — Charles D Garber
*Assistant Examiner* — Alia Sabur
(74) *Attorney, Agent, or Firm* — Winston Hsu

(57) ABSTRACT

A layout of a sense amplifier includes a pre-charge and equalizer area. A pre-charge transistor, an equalizer transistor and a gate line are disposed within the pre-charge and equalizer area. The gate line and the pre-charge transistor share a share plug. The share plug serves as a gate contact plug for the gate line and a source/drain contact plug for the pre-charge transistor.

6 Claims, 10 Drawing Sheets

LAYOUT OF SENSE AMPLIFIER

BACKGROUND OF THE INVENTION

1. Field of the Invention

The present invention relates to layout of a sense amplifier, and more particularly to layout of a sense amplifier which has a share plug.

2. Description of the Prior Art

Sense amplifiers are used in memory devices to allow for reduced voltage swing on bit lines. In a dynamic random access memory (DRAM) circuit, each data bit is stored in a small storage capacitor that is discharged quickly. A sense amplifier detects a signal representing the bit on a bit line and amplifies the signal to an amplitude close to the DRAM circuit's supply voltage. The capacitor is recharged as the signal is amplified. The data bit is refreshed before it ceases to be detectable, as the sense amplifier detects and amplifies the signal on a periodic basis, such as every few milliseconds.

As the size of semiconductors is scaled down, the density of metal lines on the sense amplifier are increased. This larger density of metal lines makes them more difficult to be patterned.

SUMMARY OF THE INVENTION

Therefore, there is a need to provide a sense amplifier layout having a lower density of metal lines than in the conventional art.

According to a preferred embodiment of the present invention, a layout of a sense amplifier includes a substrate comprising a pre-charge and equalizer area. A first direction and a second direction are defined on the substrate, wherein the first direction and the second direction are perpendicular to each other. The pre-charge and equalizer area includes an active area disposed in the substrate, wherein the active area includes a first area extending toward the second direction, a second area and a third area extending from the first area toward the first direction. The second area and the third area are parallel to each other, and the first area is perpendicular to the second area. An insulating element is disposed in the substrate and surrounds the active area. An equalizer gate line and a pre-charge gate line are disposed on the substrate, wherein the equalizer gate line and the pre-charge gate line are parallel to the first area, and the equalizer gate line and the pre-charge gate line cover the second area, the insulating element and the third area. A gate line is disposed on the substrate and parallel to the first area. The gate line covers the first area and the insulating element, wherein the pre-charge gate line is disposed between the equalizer gate line and the gate line. Two source/drain plugs are disposed in the second area and respectively at two sides of the equalizer gate line. A share plug directly contacts the first area and the gate line.

The present invention uses a share plug to decrease the number of metal lines, thereby reducing their density. In this way, it becomes easier to pattern the metal lines.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
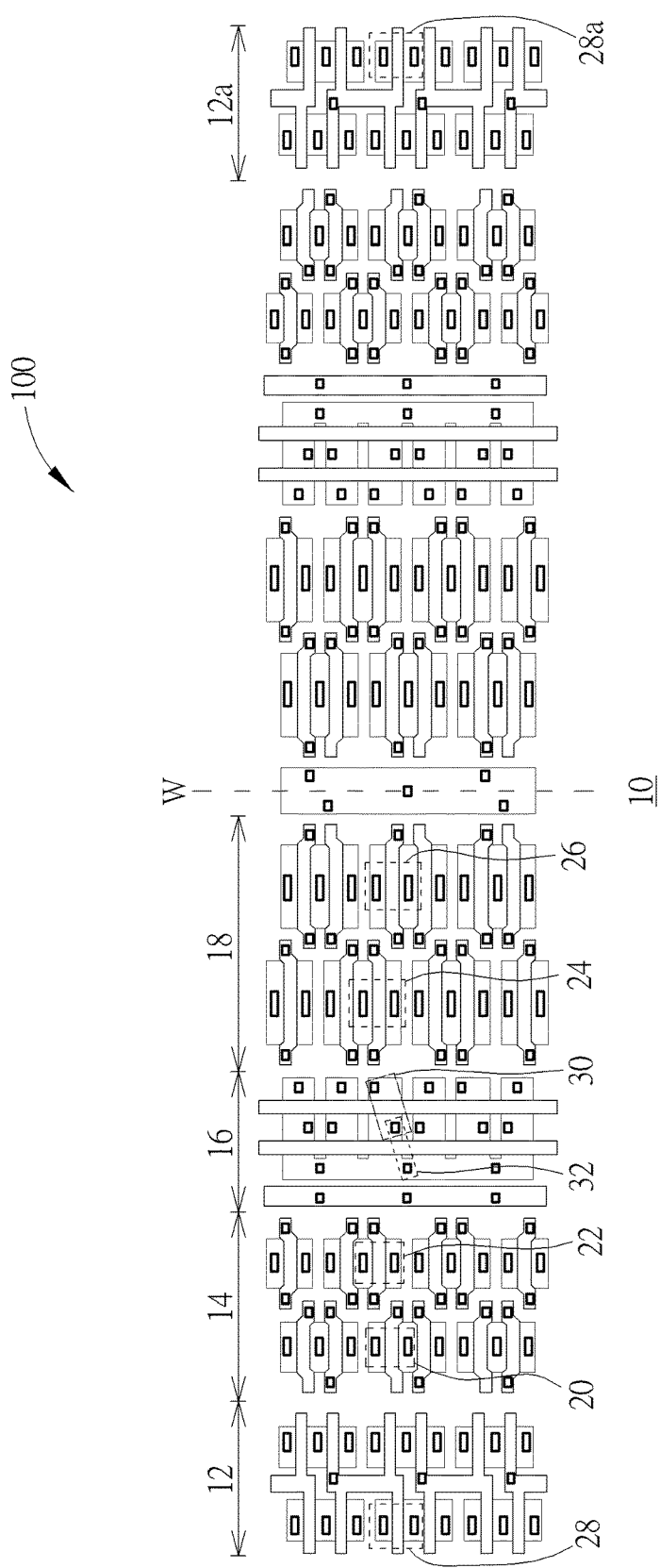
FIG. 1 depicts a layout of a sense amplifier according to a first preferred embodiment of the present invention.

FIG. 1 depicts a layout of a sense amplifier according to a first preferred embodiment of the present invention. As shown in FIG. 1, a layout of a sense amplifier 100 includes a substrate 10. The substrate 10 may be a bulk silicon substrate, a germanium substrate, a gallium arsenide substrate, a silicon germanium substrate, an indium phosphide substrate, a gallium nitride substrate, or a silicon carbide substrate. The substrate 10 is divided into a switch area 12, a first transistor area 14, a pre-charge and equalizer area 16 and a second transistor area 18. The first transistor area 14 and the second transistor area 18 are respectively at two sides of the pre-charge and equalizer area 16. The first transistor area 14 is preferably a P-type transistor area, and the second transistor area 18 is preferably an N-type transistor area. The switch area 12 is disposed at one side of the first transistor area 14. At least two transistors, such as P-type transistors 20/22, are disposed within the first transistor area 14. At least two transistors, such as N-type transistors 24/26, are disposed within the second transistor area 18.

A switch transistor 28 is disposed in the switch area 12. The switch transistor 28 is preferably an N-type transistor. An equalizer transistor 30 and pre-charge transistor 32 are disposed within the pre-charge and equalizer area 16. The switch area 12, the first transistor area 14, the pre-charge and equalizer area 16 and the second transistor area 18 are arranged symmetrically about the center line M. The transistors respectively in the switch area 12, the first transistor area 14, the pre-charge and equalizer area 16, the second transistor area 18, and the transistor 28a in a switch area 12a defined symmetrically form a sense amplifier. In addition, the sense amplifier of the present invention is suitable for being applied in a DRAM (dynamic random access memory).

Figure 2:
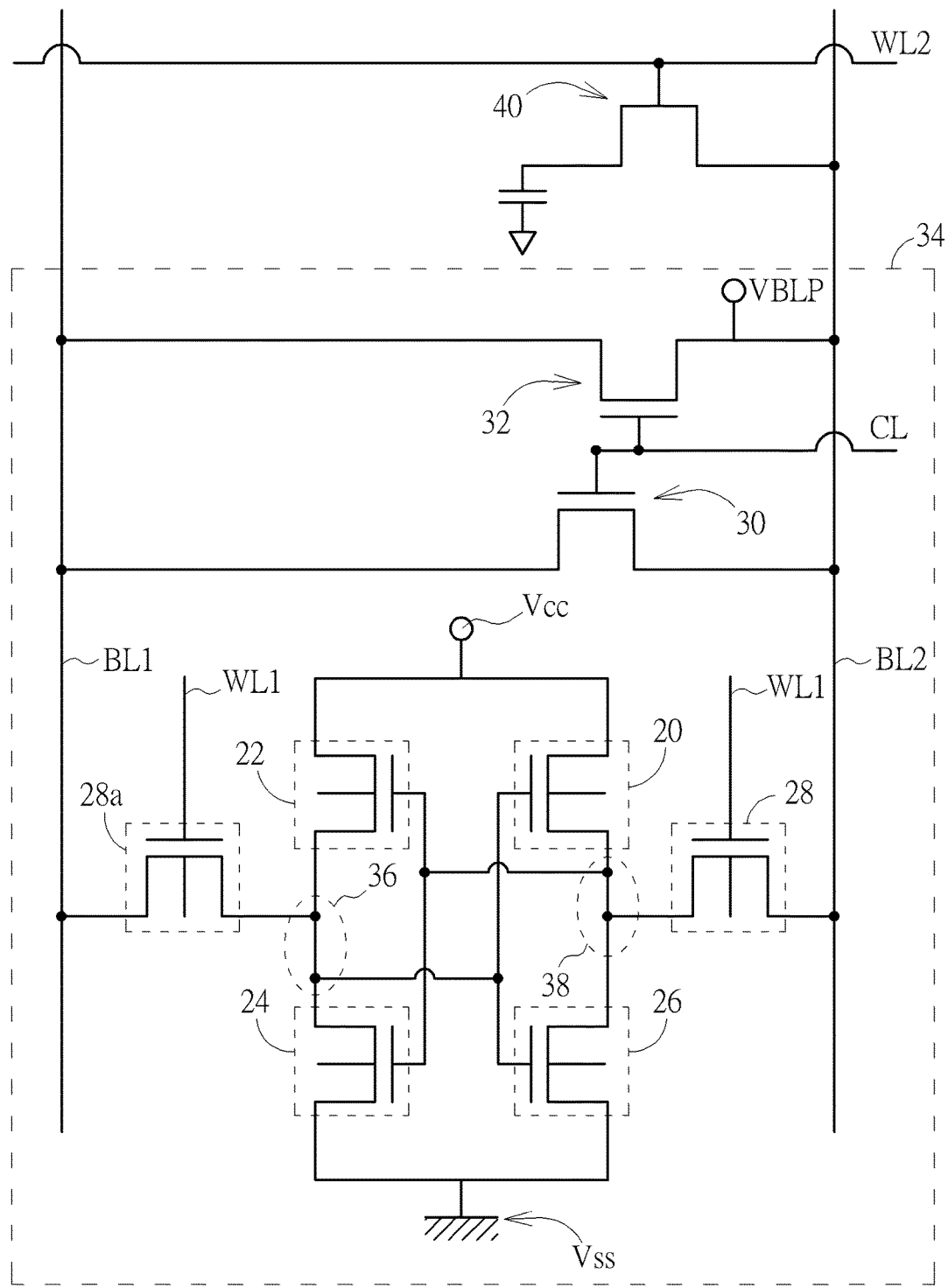
FIG. 2 depicts an equivalent circuit diagram of the sense amplifier shown in FIG. 1.

FIG. 2 depicts an equivalent circuit diagram of the sense amplifier in FIG. 1 of the present invention. Please refer to FIG. 1 and FIG. 2 together. The P-type transistor 20, the P-type transistor 22, the N-type transistor 24, and the N-type transistor 26 constitute a latch circuit that stores data in the storage nodes 36 or 38. The P-type transistor 22 and the N-type transistor 24 form an inverter, and respectively electrically connect to a voltage source Vcc and a voltage source Vss. The P-type transistor 20 and the N-type transistor 26 form another inverter, and respectively electrically connect to the voltage source Vcc and the voltage source Vss. The aforesaid inverters couple to each other to store data.

The storage node 36 electrically connects to a source of the switch transistor 28a, and the storage node 38 electrically connects to a source of the switch transistor 28. The gates of the switch transistor 28a and the switch transistor 28 are respectively coupled to a word line WL1; the drain of the switch transistor 28a and the switch transistor 28 are respectively coupled to a bit line BL1 and a bit line BL2.

Furthermore, the gates of the equalizer transistor 30, and pre-charge transistor 32 respectively couple to a conductive line CL. A source and a drain of the equalizer transistor 30 respectively couple to the bit line BL1 and bit line BL2. A source and a drain of the pre-charge transistor 32 respectively couple to the bit line BL1 and bit line BL2. A drain of a transistor in the DRAM 40 electrically connects to the bit line BL2. A gate of the transistor in the DRAM 40 electrically connects to a word line WL2.

Figure 3:
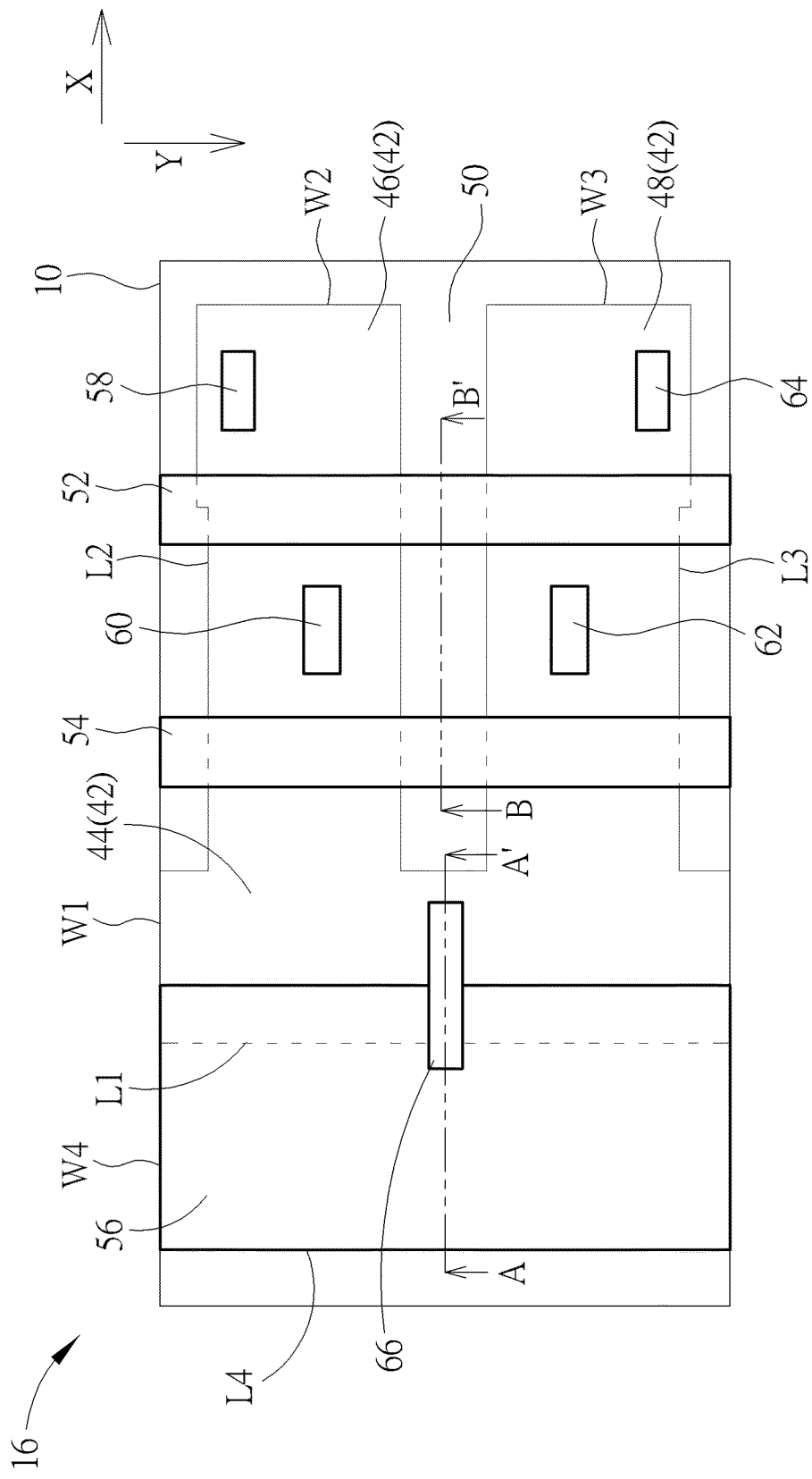
FIG. 3 depicts magnified view of a portion of a pre-charge and equalizer area shown in FIG. 1.

FIG. 3 depicts a magnified view of a portion of the pre-charge and equalizer area shown in FIG. 1. As shown in FIG. 1 and FIG. 3, the pre-charge and equalizer area 16 includes the substrate 10. A pre-charge and equalizer area 16 is disposed on the substrate 10. A first direction X and a second direction Y are perpendicular to each other. An active area 42 is disposed on the substrate 10. The active area 42 includes a first area 44, a second area 46 and a third area 48. The first area 44 extends toward the second direction Y, and the second area 46 and the third area 48 extend from the first area 44 toward the first direction X. The second area 46 and the third area 48 are parallel to each other, and the first area 44 is perpendicular to the second area 46. The aforesaid term "extend" means that the first area 44 has a long side L1 and a wide side W1, wherein the long side L1 is greater than the wide side W1. The long side L1 is parallel to the second direction Y. The second area 46 has a long side L2 and a wide side L2, and the third area 48 has a long side L3 and a wide side W3. The long side L2 is greater than the wide side W2, and the long side L3 is greater than the wide side W3. The long side L2 and the long side L3 are parallel to the first direction X.

An insulating element 50 is disposed in the substrate 10 and surrounds the active area 42. The active area 42 may be formed by etching the substrate 10 to form numerous trenches, which are then filled with an insulating material to form the insulating element 50. The insulating element 50 defines the active area 42 on the substrate 10, i.e. the material of the active area 42 and the substrate 10 is the same. The insulating element 50 can be a shallow trench isolation formed by silicon oxide.

An equalizer gate line 52 and a pre-charge gate line 54 are disposed on the substrate 10. The equalizer gate line 52 and the pre-charge gate line 54 are parallel to the first area 44. The equalizer gate line 52 and the pre-charge gate line 54 respectively include a conductive gate and a gate dielectric layer. The equalizer gate line 52 and the pre-charge gate line 54 cover the second area 46, the insulating element 50 and the third area 48. A conductive line 56 is disposed on the substrate 10 and parallel to the first area 44. The conductive line 56 includes a conductive gate and a gate dielectric layer. The conductive line 56 covers the first striped are 44 and the insulating element 50. The pre-charge gate line 54 is disposed between the equalizer gate line 52 and the gate line 56. Two source/drain plugs 58/60 are disposed in the second area 46 and respectively at two sides of the equalizer gate line 52. Another two source/drain plugs 62/64 are disposed within the third area 48 and at two sides of the equalizer gate line 52. A share plug 66 directly contacts the first area 44 and the gate line 56.

The pre-charge gate line 54, the source/drain plug 60 between the equalizer gate line 52 and the pre-charge gate line 54, the share plug 66, and part of the active area 42 form a pre-charge transistor 32. The equalizer gate line 52, the two source/drain plugs 58/60, and part of the active area 42 form an equalizer transistor 30. It is noteworthy that the share plug 66 directly contacts the first area 44 of the active area 44 and the gate line 56, the share plug 66 serving as a source/drain plug of the pre-charge transistor 32 and a gate plug of the gate line 56 simultaneously. The gate line 56 is a conductive line providing the sense amplifier 34 with a voltage of bit line pre-charge (VBLP) during a pre-charge stage. As shown in FIG. 2, the VBLP is applied to the pre-charge transistor 32.

Figure 4:
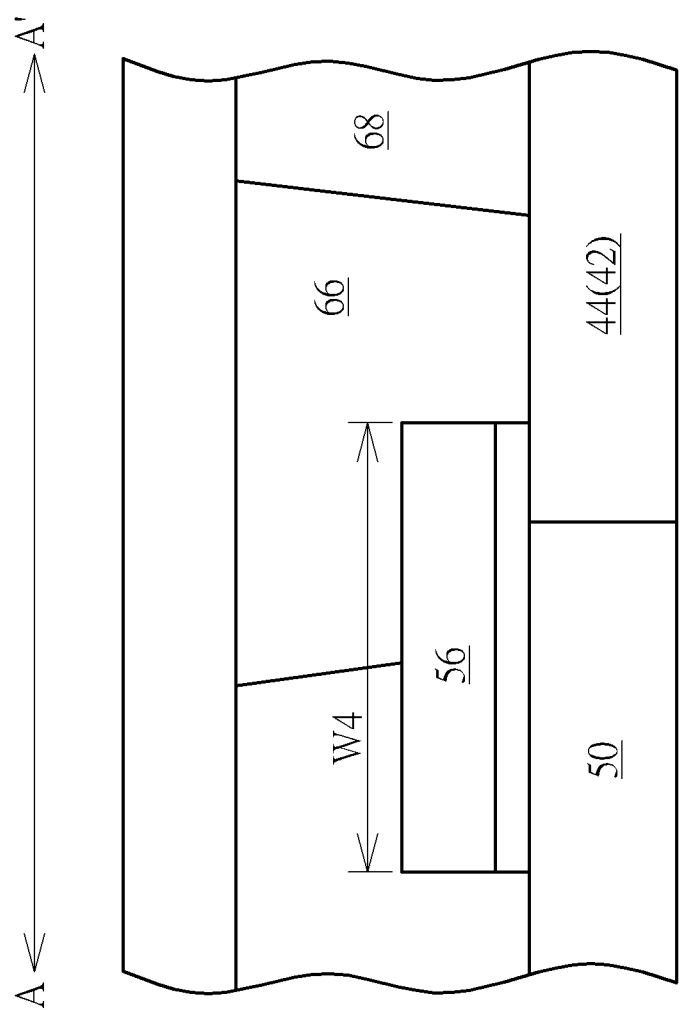
FIG. 4 shows a sectional view taken along line AA' in FIG. 3.
Figure 5:
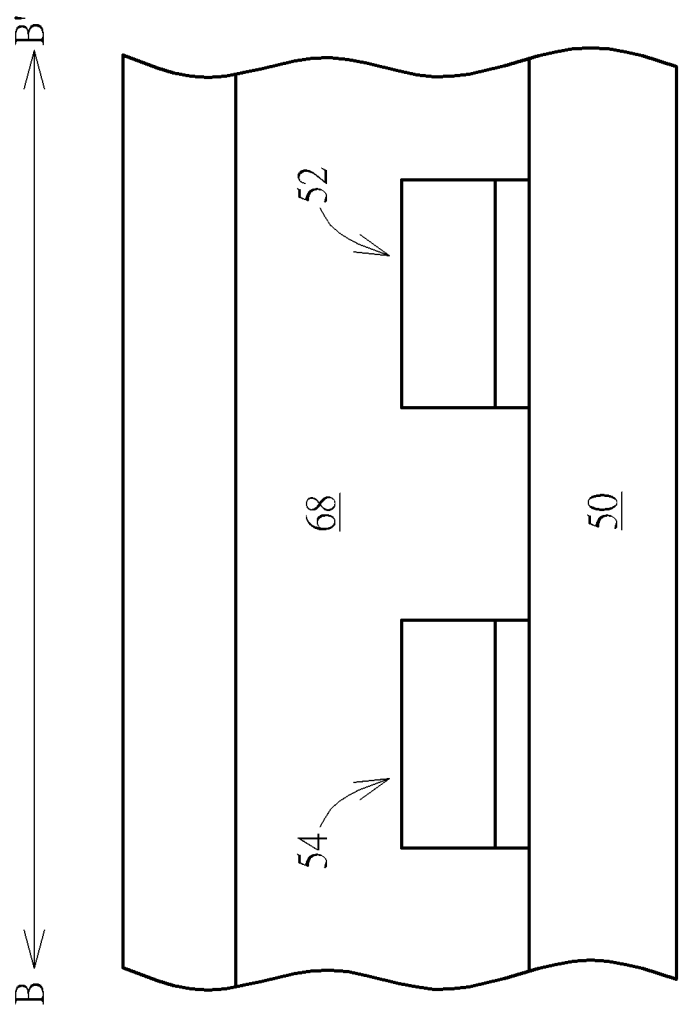
FIG. 5 shows a sectional view taken along line BB' in FIG. 3.

FIG. 4 shows a sectional view taken along line AA' in FIG. 3. As shown in FIG. 3 and FIG. 4, the gate line 56 has a long side L4 and a wide side W4. The long side L4 is greater than the wide side W4. The wide side W4 of the gate line 56 covers both the insulating element 50 and the first area 44. Furthermore, the share plug 66 directly contacts both the first area 44 and the gate line 56. An interlayer dielectric layer 68 covers the gate line 56. FIG. 5 shows a sectional view taken along line BB' in FIG. 3. Please refer to FIG. 3 and FIG. 5 together. The interlayer dielectric layer 68 covers the equalizer gate line 52 and the pre-charge gate line 54.

Figure 6:
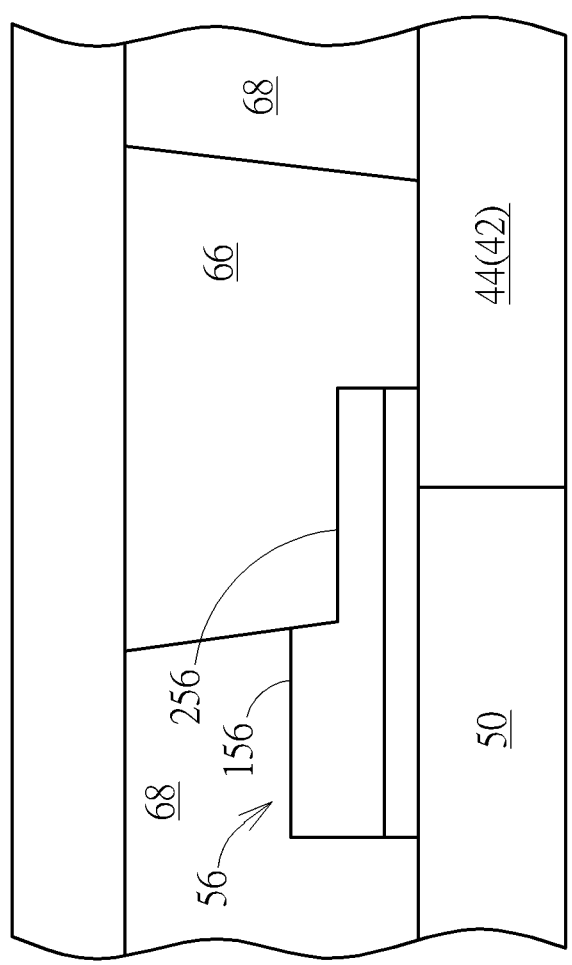
FIG. 6 shows a sectional view taken along line AA' in FIG. 3 according to another preferred embodiment of the present invention.

FIG. 6 shows a sectional view taken along line AA' in FIG. 3 according to another preferred embodiment of the present invention. The difference between FIG. 6 and FIG. 4 is that the top surface of the gate line 56 in FIG. 6 forms a step profile. In detail, the top surface of the gate line 56 includes a first top surface 156 and a second top surface 256. The first top surface 156 and the second top surface 256 form the step profile. The first top surface 156 directly contacts the interlayer dielectric layer 68. The second top surface 256 directly contacts the share plug 66 and is parallel to the first top surface 156. The first top surface 156 and the second top surface 256 are not coplanar. Therefore, the contact area between the share plug 66 and the gate line 56 in FIG. 6 is greater than in FIG. 4. In this way, the resistance of the share plug 66 can be reduced.

Figure 7:
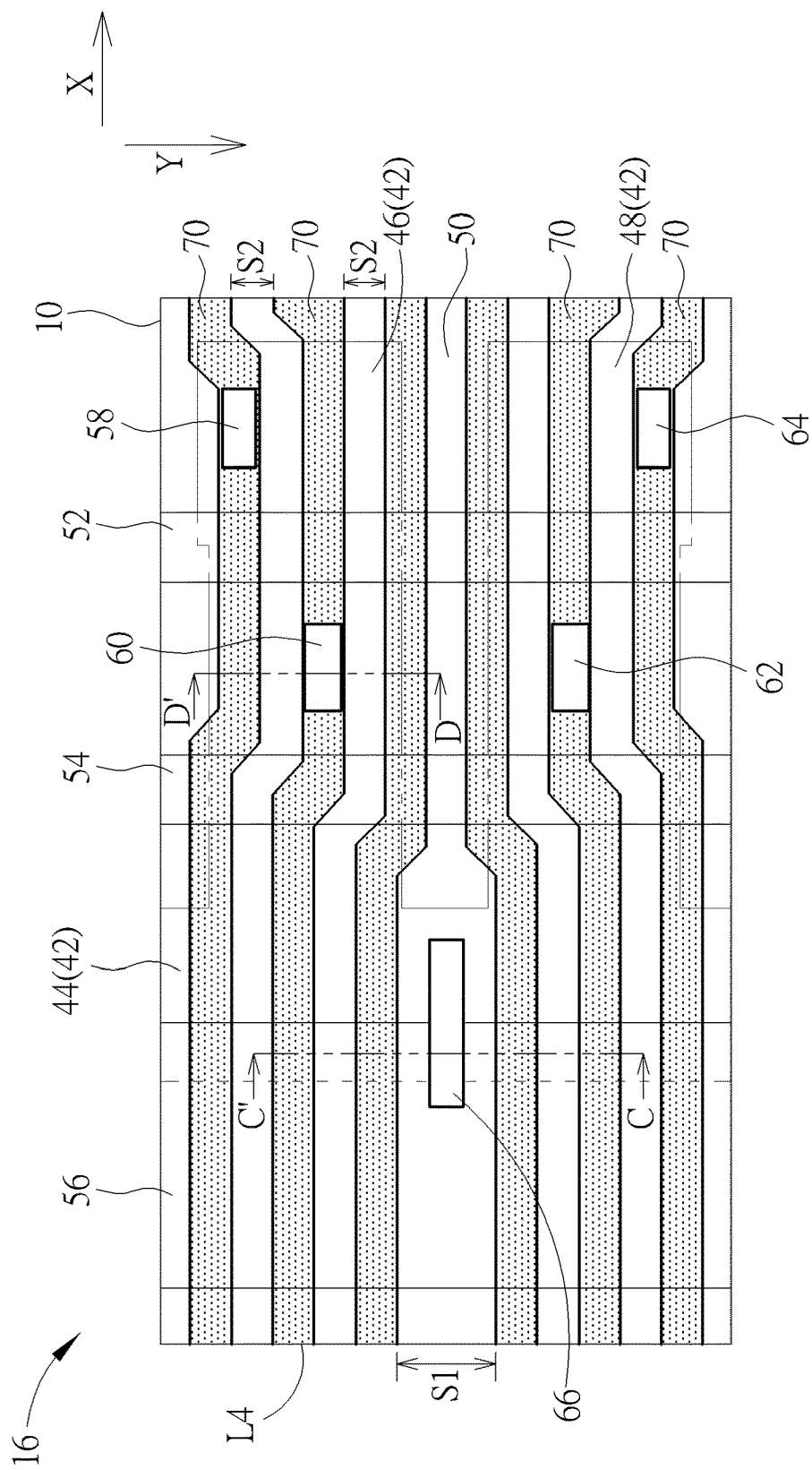
FIG. 7 depicts the layout shown in FIG. 3 stacked with metal lines.
Figure 8:
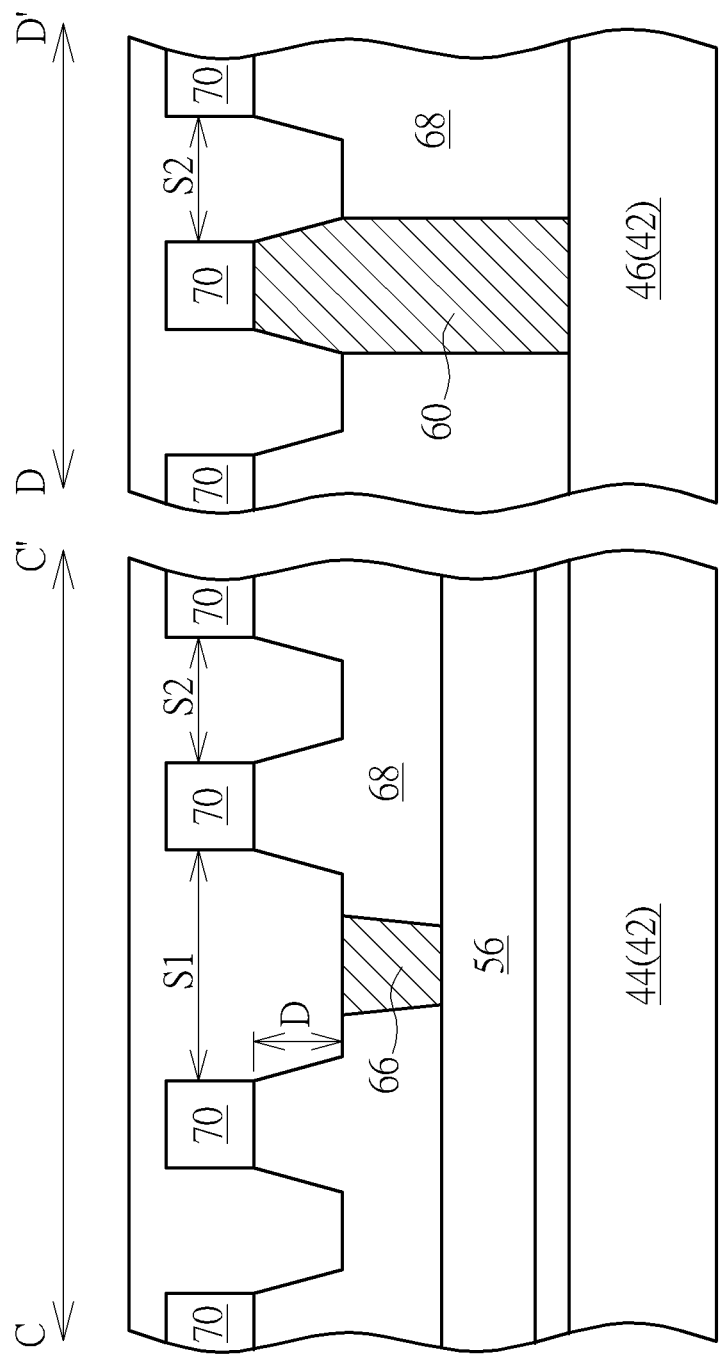
FIG. 8 are sectional view taken along line CC' and line DD' in FIG. 7.

FIG. 7 depicts the layout in FIG. 3 stacked with metal lines. FIG. 8 is a sectional view taken along line CC' and line DD' in FIG. 7. Please refer to FIG. 7 and FIG. 8 together. Numerous metal lines 70 are disposed in the pre-charge and equalizer area 16. Each metal line 70 extends toward the first direction X, and crosses the first area 44, the second area 46, and the third area of the active area 42, and crosses the insulating element 50. The interlayer dielectric layer 68 covers the equalizer gate line 52, the pre-charge gate line 54, and the gate line 56. The source/drain plugs 58/60/62/64 and the share plug 66 penetrate the interlayer dielectric layer 68. It is noteworthy that the share plug 66 does not contact any metal line 70 disposed on and contacting the interlayer dielectric layer 68. In other words, the share plug 66 does not electrically connect through the metal lines 70 to any plug which penetrates the interlayer dielectric layer 68. The metal lines 70 pass the source/drain plugs 58/60/62/64 to electrically connect to contact plugs in other regions. Because no metal line 70 passes the share plug 66, the space above the share plug 66 is not occupied by the metal lines 70. On the other hand, metal lines 70 pass the source/drain plugs 58/60/62/64, meaning the space above the source/drain plugs 58/60/62/64 is occupied by the metal lines 70. Therefore, the space S1 between two metal lines 70 at two sides of the share plug 70 is greater than the space S2 between the metal line 70 directly above the source/drain plug 58 and the metal line 70 adjacent to the metal line 70 directly above the source/drain plug 58. The space S2 is also between the metal line 70 directly above the source/drain plugs 60/62/64 and the metal line 70 adjacent to the metal line 70 directly above the source/drain plugs 60/62/64. Because the space S1 is greater than the space S2, the fabricating process of the metal lines 70 can be simplified. A distance D is between the top surface of the share plug 66 and the metal line 70 adjacent to the share plug 66, wherein the space S1 is greater than the space S2. Therefore, the parasitic capacitance around the share plug 66 is reduced.

Figure 9:
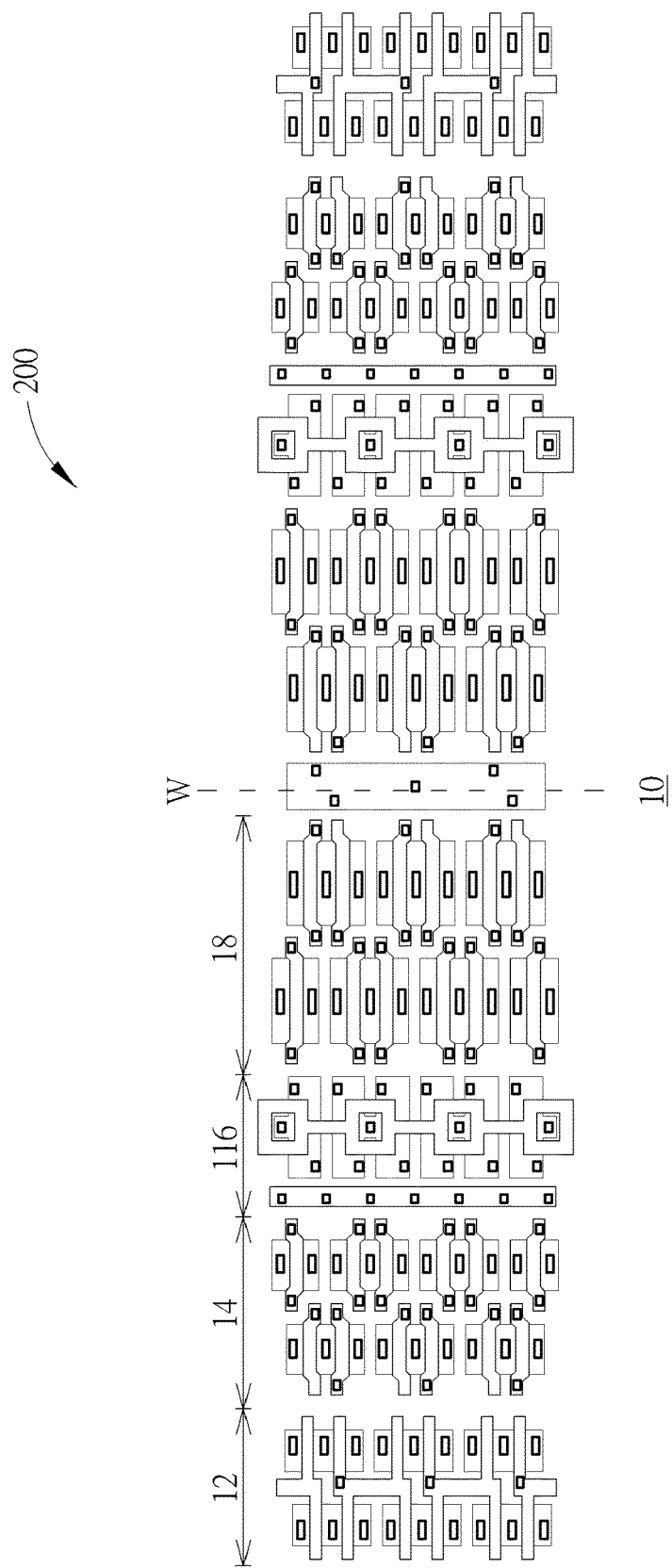
FIG. 9 shows a layout of a sense amplifier according to a second preferred embodiment of the present invention.
Figure 10:
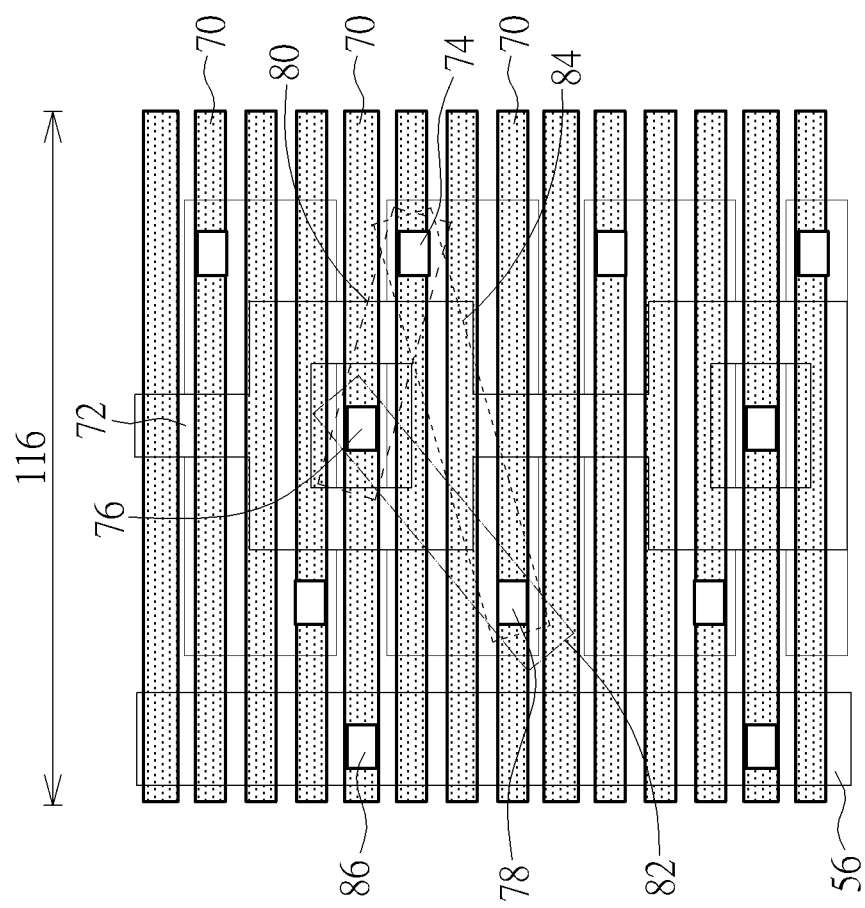
FIG. 10 depicts a magnified view of a portion of a pre-charge and equalizer area shown in FIG. 9 stacked with metal lines.

FIG. 9 shows a layout of a sense amplifier according to a second preferred embodiment of the present invention, wherein elements which are substantially the same as those in the first preferred embodiment are denoted by the same reference numerals; an accompanying explanation is therefore omitted. FIG. 10 depicts a magnified view of a portion of the pre-charge and equalizer area in FIG. 9 stacked with metal lines.

As shown in FIG. 9, a layout of a sense amplifier 200 includes a substrate 10. The substrate 10 is divided into a switch area 12, a first transistor area 14, a pre-charge and equalizer area 116 and a second transistor area 18. It is noteworthy that the layout of the pre-charge and equalizer area 116 in the second preferred embodiment is different from the layout of the pre-charge and equalizer area 16 in the first preferred embodiment. Other areas in the second preferred embodiment are the same as in the first preferred embodiment. In the second preferred embodiment, pre-charge transistors 80/82 and an equalizer transistor 84 share one common gate line 72, the active area is constituted by numerous "I"-shaped patterns, and there is no share plug in the pre-charge and equalizer area 116. In the first preferred embodiment, the gate line of the pre-charge transistor 32, and the gate line of the equalizer transistor 30 do not connect to each other, the active area 42 is comb-shaped, and there is a share plug 66. As shown in FIG. 10, in the second preferred embodiment, the source/drain plugs 74/76 and the common gate line 72 constitute the pre-charge transistor 80. The source/drain plugs 76/78 and the common gate line 72 constitute another pre-charge transistor 82. The source/drain plugs 74/78 and the common gate line 72 constitute the equalizer transistor 84.

The different layout in the pre-charge and equalizer area 116 in this second preferred embodiment make the density of the metal lines 70 greater than in the first preferred embodiment. In the second preferred embodiment, metal lines 70 pass the source/drain plugs 74/76/78. A gate line plug 86 is directly above the gate line 56. The gate line plug 86 electrically connects to the pre-charge transistor 80/82 through the metal lines 70. As there is no share plug in the second preferred embodiment, and there are more metal lines 70 in the pre-charge and equalizer area 116 than in the pre-charge and equalizer area 16, the density of the metal lines 70 around the gate line plug 86 is greater than the density of the metal lines 70 at two sides of the share plug 66. As a result, the fabricating process of patterning the metal lines 70 in the second preferred embodiment is more difficult.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout of a sense amplifier, comprising:
    a substrate comprising a pre-charge and equalizer area, wherein a first direction and a second direction are defined on the substrate, and are perpendicular to each other, and the pre-charge and equalizer area comprises:
        an active area disposed in the substrate, comprising a first area extending toward the second direction, a second area and a third area extending from the first area toward the first direction, wherein the second area and the third area are parallel to each other, and the first area is perpendicular to the second area;
        an insulating element disposed in the substrate and surrounding the active area;
        an equalizer gate line and a pre-charge gate line disposed on the substrate, wherein the equalizer gate line and the pre-charge gate line are parallel to the first area, and the equalizer gate line and the pre-charge gate line cover the second area, the insulating element and the third area;
        a gate line disposed on the substrate and parallel to the first area, the gate line covering the first area and the insulating element, wherein the pre-charge gate line is disposed between the equalizer gate line and the gate line;
        two source/drain plugs disposed in the second area and respectively at two sides of the equalizer gate line; and
        a share plug directly contacting the first area and the gate line.

2. The layout of a sense amplifier of claim 1, further comprising two source/drain plugs disposed in the third area and respectively at two sides of the equalizer gate line.

3. The layout of a sense amplifier of claim 1, further comprising:
    an interlayer dielectric layer covering the equalizer gate line, the pre-charge gate line and the gate line, wherein the two source/drain plugs and the share plug penetrate the interlayer dielectric layer; and
    a plurality of metal lines disposed on the interlayer dielectric layer, contacting the interlayer dielectric layer and the two source/drain plugs, wherein the metal lines extend toward the first direction and cross the active area;
    wherein the share plug does not contact any metal line disposed on and contacting the interlayer dielectric layer.

4. The layout of a sense amplifier of claim 3, further comprising:
    an N-type transistor area disposed on the substrate and at one side of the pre-charge and equalizer area, wherein two N-type transistors are disposed within the N-type transistor area;
    a P-type transistor area disposed on the substrate and at another side of the pre-charge and equalizer area, wherein two P-type transistors are disposed within the P-type transistor area; and
    a switch area disposed at one side of the P-type transistor area, wherein a switch transistor is disposed within the switch area.

5. The layout of a sense amplifier of claim 3, wherein a top surface of the gate line forms a step profile.

6. The layout of a sense amplifier of claim 1, wherein part of the equalizer gate line, the two source/drain plugs, and part of the active area form an equalizer transistor, and part of the pre-charge gate line, the source/drain plug between the equalizer gate line and the pre-charge gate line, the share plug and part of the active area form a pre-charge transistor.

* * * * *